United States Patent
Deval et al.

(10) Patent No.: US 7,961,126 B2
(45) Date of Patent: Jun. 14, 2011

(54) METHOD AND APPARATUS FOR DITHERING IN MULTI-BIT SIGMA-DELTA ANALOG-TO-DIGITAL CONVERTERS

(75) Inventors: Philippe Deval, Lutry (CH); Vincent Quiquempoix, Divonne les Bains (FR); Alexandre Barreto, Morges (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/579,113

(22) Filed: Oct. 14, 2009

(65) Prior Publication Data

US 2010/0103003 A1    Apr. 29, 2010

Related U.S. Application Data

(60) Provisional application No. 61/107,820, filed on Oct. 23, 2008.

(51) Int. Cl.
  *H03M 1/20*    (2006.01)
(52) U.S. Cl. .................. 341/131; 341/143; 341/155
(58) Field of Classification Search .......... 341/131, 341/143, 155, 159
  See application file for complete search history.

(56) References Cited

U.S. PATENT DOCUMENTS

| | | | |
|---|---|---|---|
| 4,034,197 A | 7/1977 | Lawrence et al. | 235/156 |
| 4,606,004 A | 8/1986 | Crawford et al. | 364/414 |
| 4,965,668 A | 10/1990 | Abt et al. | 358/160 |
| 5,087,914 A * | 2/1992 | Sooch et al. | 341/120 |
| 5,252,973 A * | 10/1993 | Masuda | 341/131 |
| 5,406,283 A | 4/1995 | Leung | 341/143 |
| 6,172,628 B1 * | 1/2001 | Sculley et al. | 341/120 |
| 6,304,608 B1 | 10/2001 | Chen et al. | 375/252 |
| 6,388,595 B1 | 5/2002 | Edwards et al. | 341/131 |
| 6,426,714 B1 | 7/2002 | Ruha et al. | 341/143 |
| 6,462,685 B1 * | 10/2002 | Korkala | 341/131 |
| 6,473,019 B1 * | 10/2002 | Ruha et al. | 341/143 |
| 6,515,601 B2 * | 2/2003 | Fukuhara et al. | 341/131 |
| 6,515,603 B1 * | 2/2003 | McGrath | 341/143 |
| 6,894,631 B1 | 5/2005 | Bardsley | 341/120 |
| 7,425,910 B1 * | 9/2008 | He et al. | 341/143 |
| 7,471,223 B2 * | 12/2008 | Lee | 341/131 |

(Continued)

FOREIGN PATENT DOCUMENTS

DE    3509777 A1    9/1985

(Continued)

OTHER PUBLICATIONS

International PCT Search Report and Written Opinion, PCT/US2009/061597, 16 pages, Mailed Apr. 14, 2010.

(Continued)

*Primary Examiner* — Khai M Nguyen
(74) *Attorney, Agent, or Firm* — King & Spalding L.L.P.

(57) ABSTRACT

A multi-bit (M-bit, M>1) or multi-level (nlev levels, nlev>2, encoded on M bits where M=Floor(log 2(nlev))) sigma-delta analog-to-digital converter (ADC) with a variable resolution multi-bit quantizer having its resolution (number of distinct output levels) and associated quantization thresholds changed for each voltage sample with a random or pseudo-random sequence N(n) to provide automatic dynamic dithering for removing undesired idle tones in the digital output of the sigma-delta ADC. The random integer numbers N(n) between 2 and nlev may be provided by a random or pseudo-random sequence generator, e.g., Galois linear feedback shift register in combination with digital comparators and an adder.

20 Claims, 11 Drawing Sheets

U.S. PATENT DOCUMENTS

| | | | |
|---|---|---|---|
| 2004/0036636 A1* | 2/2004 | Mai et al. | 341/131 |
| 2005/0275577 A1 | 12/2005 | Bjornsen | 341/155 |
| 2006/0187105 A1 | 8/2006 | Sakata et al. | 341/155 |
| 2007/0040718 A1 | 2/2007 | Lee | 341/143 |
| 2007/0222656 A1 | 9/2007 | Melanson | 341/155 |

FOREIGN PATENT DOCUMENTS

| | | |
|---|---|---|
| EP | 1434354 A2 | 6/2004 |
| GB | 2175167 A | 11/1986 |
| WO | 00/44098 | 7/2000 |
| WO | 02/23728 | 3/2002 |
| WO | 2006/023355 A1 | 3/2006 |
| WO | 2008/014246 A1 | 1/2008 |

OTHER PUBLICATIONS

International PCT Search Report and Written Opinion, PCT/US2009/061599, 15 pages, Mailed Apr. 12, 2010.

XP010536177, Gulati, K., et al., "A Low-Power Reconfigurable Analog-to-Digital Converter", Solid State Circuits Conference; Digest of Technical Papers, ISSCC.2001 IEEE International, Piscataway, NJ., 3 pages, Feb. 5, 2001.

* cited by examiner

METHOD AND APPARATUS FOR DITHERING IN MULTI-BIT SIGMA-DELTA ANALOG-TO-DIGITAL CONVERTERS

RELATED PATENT APPLICATION

This application claims priority to commonly owned U.S. Provisional Patent Application Ser. No. 61/107,820; filed Oct. 23, 2008; entitled "Method and Apparatus for Dithering in Multi-Bit Sigma-Delta Digital-to-Analog Converters," by Philippe Deval, Vincent Quiquempoix and Alexandre Barreto; and is hereby incorporated by reference herein for all purposes; and is related to commonly owned U.S. patent application Ser. No. 12/571,892; filed Oct. 1, 2009; entitled "Method and Apparatus for Dithering in Multi-Bit Sigma-Delta Digital-to-Analog Converters," by Philippe Deval, Vincent Quiquempoix and Alexandre Barreto.

TECHNICAL FIELD

The present disclosure relates to analog-to-digital converters (ADCs) and, more particularly, to a sigma-delta ADC with a multi-bit (M-bit, M>1) variable resolution quantizer having automatic dynamic dithering for removing undesired idle tones in the digital output of the sigma-delta ADC.

BACKGROUND

Analog-to-digital converters (ADCs) are in widespread use today in electronic applications for consumer, medical, industrial, etc. Typically, ADCs include circuitry for receiving an analog input signal and outputting a digital value proportional to the analog input signal. This digital value is typically in the form of either a parallel word or a serial digital bit stream. There are many types of analog-to-digital conversion schemes such as voltage-to-frequency conversion, charge redistribution, delta modulation, as well as others. Typically, each of these conversion schemes has its advantages and disadvantages.

One type of analog-to-digital converter (ADC) that has seen increasing use is the sigma-delta ADC (sigma-delta and delta-sigma will be used interchangeably herein). A sigma-delta modulator typically converts an analog input to a digital serial string of "ones" and "zeros" having an average amplitude over time proportional to the analog input. Sigma-delta modulation generally provides for high accuracy and wide dynamic range as compared to earlier delta modulation techniques. Sigma-delta modulation is often referred to as an oversampled converter architecture and is typically immune from some of the earlier undesirable second order effects of delta modulation.

Each sigma-delta modulator loop includes one or more quantizers that convert the analog incoming signals to a digital output code. For a sigma-delta ADC, these quantizers are low-resolution ADCs often 1-bit ADC (or comparators). In this case, the sigma-delta modulator is called a 1-bit modulator. If the output of the quantizer has a higher resolution than 1 bit, then the sigma-delta modulator is called a multi-bit modulator and the sigma-delta ADC is called a multi-bit sigma-delta ADC.

In a multi-bit sigma-delta ADC, the output resolution allows more than 2 digital output levels. If the number of possible output levels (nlev) is a power of 2 (for example nlev=2^M), the output can be encoded into an M-bit word and the modulator is a multi-bit M-bit modulator. However, the number of output levels (nlev) is not necessarily a power of 2 (especially for the low number of levels) and in this case, the modulator can also be called multi-bit or multi-level. For example, 3-level modulators are very popular. If nlev is a power of 2, an equivalent number of bits can be calculated for a multi-level modulator and is given by the formula: M=log 2(nlev) where M is the number of equivalent bits. If nlev is not a power of 2, the minimum number of bits required to encode the output is: M=Floor(log 2(nlev)).

In a multi-level (or multi-bit) sigma-delta ADC, the quantizer is very often a Flash ADC, composed of nlev−1 comparators in parallel with equidistant thresholds of comparison, placed at (nlev−2k)/(nlev−1)*Vref where k is an integer between 1 and (nlev−1), giving an output on nlev bits coded with a thermometer coding. In that case, the number of distinct output levels is nlev which can be coded into a minimum of Floor(log 2(nlev)) bits. For example, a 3-level modulator quantizer can be a Flash ADC composed of two (2) comparators with thresholds of +Vref/2 and −Vref/2 and the 3-level output words can be encoded into Foor(log 2(3))=2 bits. The placement of the thresholds ensures also a uniform quantization which minimizes the quantization error average on the whole input range. In a typical flash ADC implementation, each comparator has its own switched-capacitor input stage in determining its associated voltage threshold, and a thermometer-to-binary encoder at the outputs of the flash comparators for generating the digital words to the sigma-delta modulator loop digital-to-analog converter (DAC), and a digital signal output decimation filter.

All sigma-delta modulators, working in a continuous mode, produce idle tones at their outputs if a certain periodic or direct current (DC) input is provided. These idle tones are due to the quantization process and are inherent in the design of the sigma-delta modulator architecture.

These idle tones are unwanted and create undesired behavior at the outputs like undesired high tones in an audio device. These tones limit the spurious free dynamic range (SFDR) and thus the signal-to-noise-and-distortion (SINAD) of the device especially if specific direct current (DC) inputs are provided (that are usually a rational fraction of the quantization step).

SUMMARY

Therefore, what is needed is a way to remove these idle tones. By "breaking" and "scrambling" the idle tones with the addition of a pseudo-random signal inside the sigma-delta modulator loop, the resulting signal may then be filtered in the loop itself to remove the idle tones, thus there is no need to add filtering at the digital output to recover the desired signal and eliminate the idle tones.

One of the best locations for adding a dithering signal is at the input of the modulator quantizer. Any error at this location is re-divided by the gain of the modulator loop which is very large, and then is filtered and noise-shaped exactly like the quantization noise without any need of additional filtering circuitry. If this signal is random or pseudo-random (uncorrelated with the input), it will vary the bitstream sequence for a given input signal and break the periodicity of it due to its random nature.

According to the teachings of this disclosure, in a multi-bit (or multi-level) sigma-delta ADC that has an nlev (nlev>2) resolution quantizer (in that case the nlev levels can be encoded on M bits where M=Floor(log 2(nlev)), so M>1), when replacing the quantizer with a variable resolution quantizer where the resolution (number of output levels) of the quantizer varies with a random or pseudo-random sequence (named the resolution sequence), it creates a new quantization error function, depending on this sequence, which introduces an additional quantization error that will dither the incoming input signal. The added quantization error is the difference between the output of the fixed quantizer with the maximum resolution (nlev) and the output of the quantizer with variable resolution where the resolution N(n) is chosen at each sample n by a random or pseudo-random sequence N(n) (the resolution sequence) and where N(n) is an integer between 2 and nlev. When this type of dithering is added at the quantizer stage, the induced additional quantization errors will also be processed and noise-shaped by the feedback loop of the sigma-delta modulator and filtered away, thereby eliminating the need for additional output filters often necessary with other types of dithering schemes.

Dithering the modulator quantizer resolution, as more fully described hereinafter, is also automatically dynamic, since the quantization error is unchanged for large absolute values of quantizer inputs no matter what resolution is chosen by the random or pseudo-random sequence. According to the teachings of this disclosure, the feedback DAC in the sigma-delta loop will always feedback the maximum output value, no matter what resolution is chosen, and therefore the variable resolution quantizer gives the same quantization error as a fixed nlev-resolution quantizer because there is no added quantization error for a maximum output value. The amount of added signal with the variable resolution quantizer is automatically lowered to no influence (introduction of error) for large signals and thereby provides very good stability performance without additional circuitry. Whereas other existing dithering techniques have to evaluate the input signals and adapt the amount of added signals to avoid saturating the quantizer inputs when large signals are present. This may require additional circuitry and cause loop instability.

Implementation of signal dithering in sigma-delta ADCs, according to the teachings of this disclosure, is also simple to put in place and does not require significant additional circuitry to provide efficient tone scrambling. When starting from a multi-level (nlev) ADC it only requires minor additional circuitry to make adjustable the number of levels and the associated thresholds of the quantizer (which is often a flash ADC) so that the quantizer can vary its resolution for each sample taken. Additionally, a random or pseudo-random generator is implemented to control the resolution sequence N(n) that will vary the resolution at each sample.

The resolution sequence may be any value from 2 to nlev or may be selected ones of all possible values from 2 to nlev. The resolution sequence is random or pseudo-random (e.g., uncorrelated with the input signal) so that the dithering effect is maximized. Using a larger proportion of small levels (e.g., two (2) levels) will also make the dithering more pronounced but as a side effect will increase the output quantization noise (and thus decrease SNR), and will also degrade the stability of the ADC loop. The length of the sequence in case of a pseudo-random one is determined as a function of the need for dithering low-frequency signals: a long sequence will "scramble" idle tones appearing at a lower frequency and will "smooth" further the low frequency portion of the output spectrum. The "granularity" of the sequence (number of distinct N values taken in the resolution sequence) may be freely chosen knowing that a large number of distinct levels will induce better randomness resulting in a better dithering effect.

When using flash ADC quantizers, only a few additional switches are required in order to change the quantizer resolution for proper quantization resolution of the dithering sequence, according to the teachings of this disclosure. The flash ADC quantizer comprises (nlev−1) comparators in parallel, each comparator having a different comparison threshold: threshold(k), where k is an integer between 1 and (nlev−1). These comparison thresholds may be equal to: threshold(k)=(nlev−2k)/(nlev−1)*Vref which results in a uniform quantization. The comparator comparison thresholds may be defined by a switched-capacitor stage with different capacitor ratios, as more fully described hereinafter. In order to change the resolution of the flash ADC, only a group of N(n)−1 out of the total (nlev−1) comparators need be used, giving N(n) distinct output levels (resolution). If a uniform quantization is desired (less quantization error) for each N(n) in the sequence, the comparators that are chosen to be used need to have their threshold values modified accordingly so that their thresholds are equal to threshold(k,n)=(N(n)−2k)/(N(n)−1)*Vref, where k is an integer between 1 and N(n)−1. Modifying the capacitor ratios changes the thresholds of each active comparator of the flash ADC quantizer so that they are equal to their new value at each sample. Modifying capacitors ratios is possible by enabling or disabling one or more unit caps in the Cin or the Cref arrangement with appropriate switches, as more fully described hereinafter. Capacitor arrangements may be implemented so that all necessary threshold combinations are available.

Furthermore, for a lower power implementation, the comparators that are not required at a given sample n (total of nlev−N(n) comparators) can be shutdown (e.g., put into a low power mode) during the sample because their outputs are not used in the feedback DAC and are thereby not taken into account when encoding the bitstream in the sigma-delta modulator.

According to a specific implementation of this disclosure, when nlev=5, where N(n) is chosen between 2, 3 and 5 (N(n) is in the form of 2^r+1, where r is an integer), and when the quantization is uniform, the DAC output levels are +Vref, +Vref/2, 0, −Vref/2 and −Vref when N(n)=5; +Vref, 0, −Vref when N(n)=3; and +Vref and −Vref when N(n)=2. Since the output levels needed when N(n)=2, 3 or 5 are the same ones as the ones of a fixed five-level DAC, e.g., the DAC in the feedback loop of the sigma-delta ADC can be implemented according to the teachings of commonly owned U.S. Pat. No. 7,102,558, entitled "Five-Level Feed-Back Digital-to-Analog Converter for a Switched Capacitor Sigma-Delta Analog-to-Digital Converter" by Philippe Deval, and is incorporated by reference herein for all purposes. This reference discloses an implementation that it is inherently linear each time, for each sample taken and for any resolution sequence. Therefore, this implementation ensures an inherent linearity and thus extremely low THD figure and higher SINAD figure while keeping the advantages of dithering and low-complexity implementation.

An advantage of the dithering process disclosed herein is that the dithering has substantially no effect on large inputs signals which greatly helps for maintaining stability of the sigma-delta modulator.

Another advantage of the dithering process disclosed herein is simplicity and ease of implementation with only a few additional switches to change capacitor ratios in the capacitor switched inputs of the comparators of a flash ADC implementation.

Another advantage of the dithering process disclosed herein is that it also reduces total harmonic distortion (THD), because its effect on distortion, which can be considered as a specific type of idle tone, is equivalent to its effect on any other tone. It "scrambles" the harmonics with the same efficiency as if they were an idle tone coming from the quantization process even though the root cause of harmonic distortion may be different.

Another advantage of the dithering process disclosed herein is that it can be easily switched off. In order to switch off the dithering process, the resolution sequence N(n) can be made equal to nlev for all samples (N(n)=nlev).

According to a specific example embodiment of this disclosure, an apparatus for reduction of unwanted idle tones by dithering a variable resolution nlev (nlev>2) quantizer of a multi-bit (M-bit, M>1, M=Floor(log 2(nlev))) sigma-delta analog-to-digital converter (ADC) comprises; a multi-bit (M-bit, M>1) sigma-delta modulator comprising a multi-level digital-to-analog converter (DAC), an analog voltage summation circuit coupled to the multi-level DAC, an analog loop filter coupled to an output of the analog voltage summation circuit, a variable resolution quantizer having nlev (nlev>2) levels coupled to the analog loop filter, an encoder coupled to the variable resolution quantizer, wherein the encoder converts outputs from the variable resolution quantizer into binary representations thereof and the binary representations are applied to the multi-level DAC, and a random sequence generator coupled to the variable resolution quantizer, wherein the random sequence generator generates a plurality of random numbers N(n) in a sequence, where N(n) are random integer numbers between 2 and nlev, whereby resolutions of the variable resolution quantizer are determined by respective ones of the plurality of random numbers N(n) for each analog voltage sample taken by the sigma-delta modulator; a voltage reference coupled to the multi-level DAC; and a digital filter coupled to the encoder and receiving the binary representations therefrom.

According to another specific example embodiment of this disclosure, a method for reducing unwanted idle tones by dithering a variable resolution nlev (nlev>2) quantizer of a multi-bit (M-bit, M>1, M=Floor(log 2(nlev))) sigma-delta analog-to-digital converter (ADC) comprises the steps of: generating random numbers N(n) in a random sequence with a random sequence generator, where N(n) are random integer numbers between 2 and nlev; controlling voltage thresholds and number of distinct output levels nlev (nlev>2) of a variable resolution quantizer with the random numbers N(n); encoding outputs from the variable resolution quantizer, based upon the random numbers N(n), into binary representations thereof; controlling output voltage values from a multi-level digital-to-analog converter (DAC) with the binary representations; adding the voltage values from the multi-level DAC to input voltage samples in an analog voltage summation circuit; filtering the sum of the voltage values and the input voltage samples in an analog loop filter; and applying the filtered sum of the voltage values and the input voltage samples to the variable resolution quantizer.

BRIEF DESCRIPTION OF THE DRAWINGS

A more complete understanding of the present disclosure thereof may be acquired by referring to the following description taken in conjunction with the accompanying drawings wherein.

Figure 1:
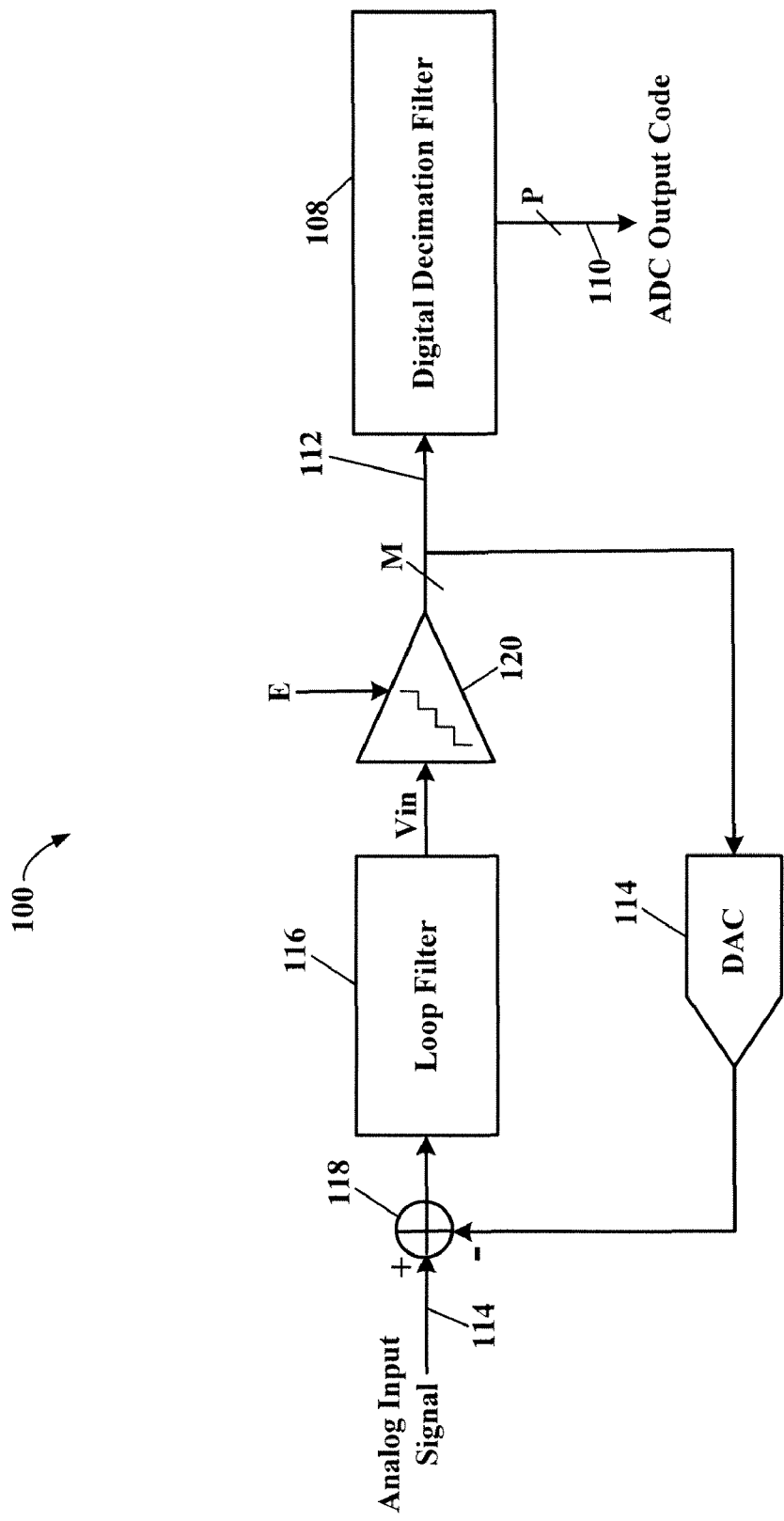
FIG. 1 illustrates a schematic block diagram of a multi-bit or multi-level (nlev levels, nlev>2, M-bit, M=Floor(log 2(nlev)), M>1) single-loop sigma-delta analog-to-digital converter (ADC) with a fixed quantizer.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a multi-bit or multi-level (nlev levels, nlev>2, M-bit, M=Floor(log 2(nlev)), M>1) single-loop sigma-delta analogto-digital converter (ADC) with a fixed quantizer. Generally represented by the numeral 100, a multi-level (nlev) sigma-delta ADC with a fixed quantizer (may also be referred to as multi-bit since the encoding of the levels require more than 1 bit, M>1) comprises an input voltage summation node 118, a loop filter 116, a fixed multi-bit quantizer 120, a multi-bit digital-to-analog converter (DAC) 114, and a digital decimation filter 108.

The digital filter 108 receives an over sampled digital bit stream 112 and decimates the digital bit stream 112 so as to produce, for example but is not limited to, a P-bit data word (on bus 110) representative of the measured analog input signal at input 114. This decimation process also removes most of the high frequency noise that is coming from the quantization process and that is noise shaped by the sigma-delta ADC 100 throughout its analog loop filter 116. The transfer function from E (quantization noise introduced by the quantizer) to the output bitstream is a high-pass filter.

The output bitstream 112 from the fixed multi-bit quantizer 120 has nlev distinct levels that is fixed in number and may be encoded into a minimum of M-bits, where M=Floor(log 2(nlev)) and M is greater than 1. "E" schematically represents the quantization error introduced by the fixed multi-bit quantizer 120.

Figure 2:
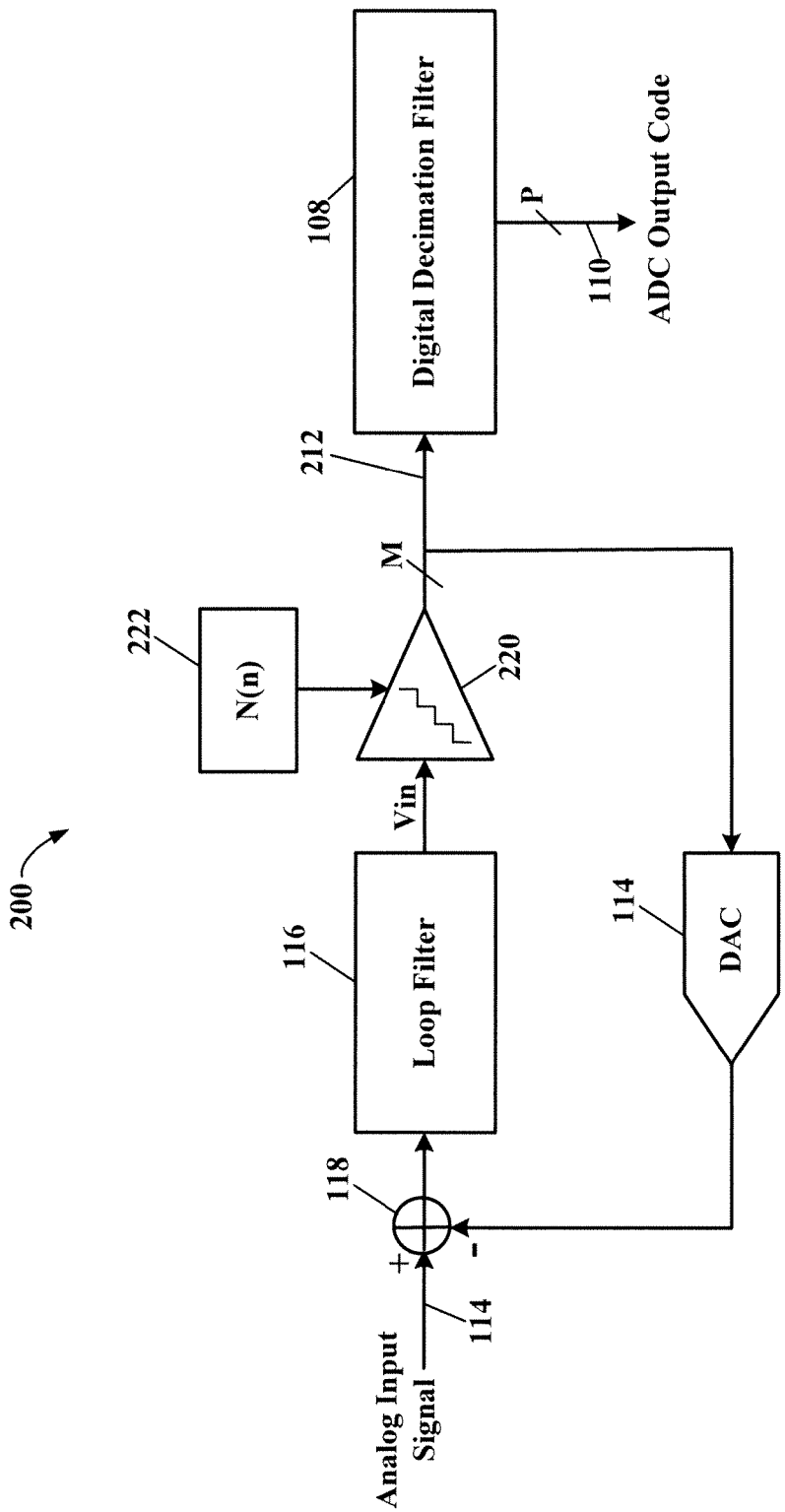
FIG. 2 illustrates a schematic block diagram of a single-loop sigma-delta multi-bit (M-bit, M>1) modulator having a variable resolution quantizer controlled by a random or pseudo random sequence generator that dithers the signal coming from the loop filter or the modulator, according to a specific example embodiment of this disclosure.

Referring to FIG. 2, depicted is a schematic block diagram of a single-loop sigma-delta multi-bit (M-bit, M>1) modulator having a variable resolution quantizer coupled to a random sequence generator that dithers the signal incoming from the loop filter or the modulator, according to a specific example embodiment of this disclosure. Generally represented by the numeral 200, a multi-level (nlev) sigma-delta ADC with variable resolution quantizer comprises an input voltage summation node 118, a loop filter 116, a variable resolution multi-bit quantizer 220, a multi-bit digital-to-analog converter (DAC) 114, a random sequence generator 222 having a resolution sequence N(n), and a digital decimation filter 108. A single feedback loop is shown in FIG. 2, however, multi-loop (cascaded, MASH, etc.) with multiple variable resolution quantizers may be used, according to the teachings of this disclosure, and are contemplated herein. The output bitstream 212 has N(n) distinct levels and may be encoded into M-bits where M=Floor(log 2(nlev)) and M>1. The number of levels of the variable resolution multi-bit quantizer 220 may change for each sample n, where N(n) comprises integer values between 2 and nlev.

The random sequence generator 222 generates random or pseudo-random number sequences, N(n). At each voltage sample n taken by the sigma-delta ADC 200, a random integer number between 2 and nlev is output from the random sequence generator 222. The random number sequence N(n) generated by the random sequence generator 222 is hereinafter called a "resolution sequence." The random sequence generator 220 may be, for example but is not limited to, a Galois linear feedback shift register (LFSR), digital comparators and an adder as more fully described hereinafter (see FIG. 3). The random sequence generator 222 introduces dithering by controlling the resolution level of the variable resolution multi-bit quantizer 220, according to the teachings of this disclosure.

Figure 3:
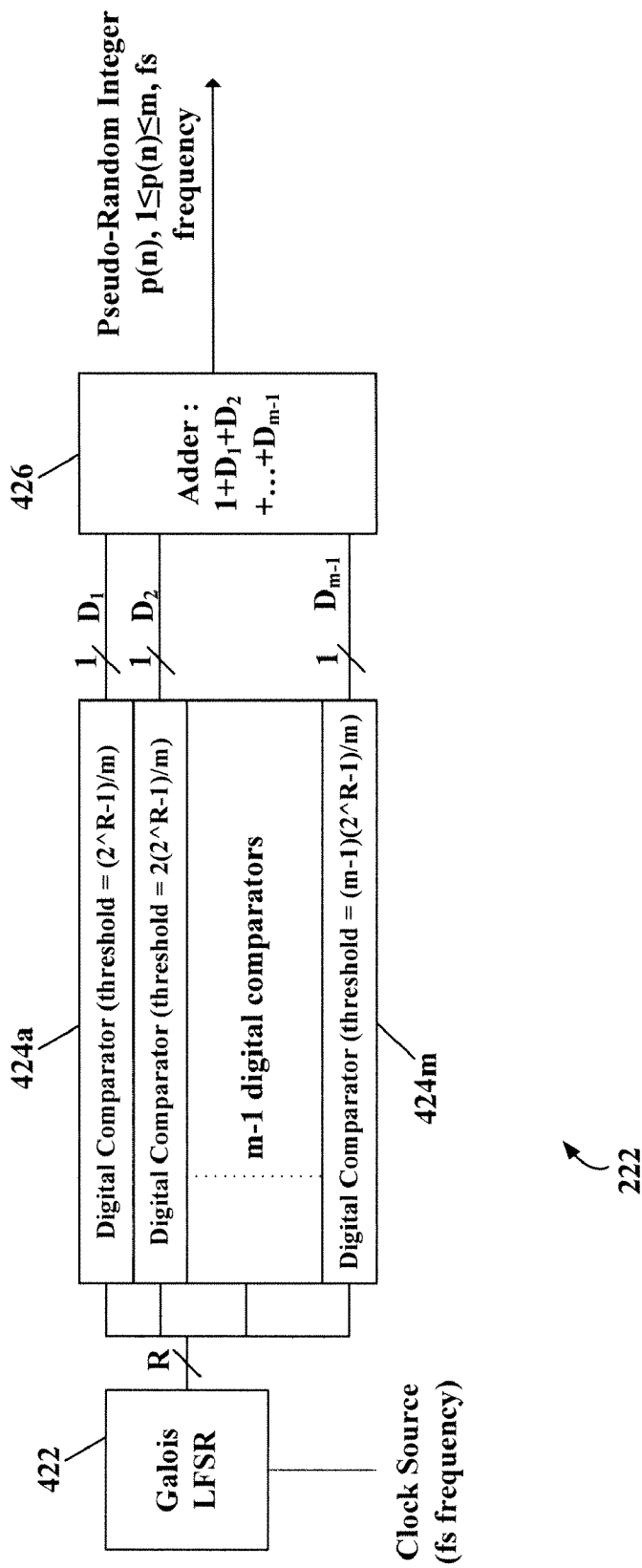
FIG. 3 illustrates a more detailed schematic block diagram of a pseudo-random sequence generator, according to the specific example embodiment shown in FIG. 2.

Referring to FIG. 3, depicted is a more detailed schematic block diagram of a pseudo-random sequence generator, according to the specific example embodiment shown in FIG. 2. The pseudo-random generator 222 generates a pseudo-random integer p(n) between one (1) and m, where m is an integer value greater than one (1), at each sample n, clocked at the frequency, fs. The pseudo-random sequence generator 222 may comprise an R-bit Galois LFSR (Linear Feedback Shift Register) 422, m−1 parallel digital comparators 424 and an adder 426. This pseudo-random sequence generator 222 has an equiprobable distribution and generates equiprobable integer numbers p(n) in a pseudo-random sequence, p(n) being between 1 and m. The pseudo-random sequence generator 222 is equiprobable if (2^R−1) is a multiple of m since all integer numbers are taken in the LFSR register from 1 to 2^R−1 only once per full cycle of the LFSR 422. This pseudo-random integer sequence p(n) can be used to represent the resolution sequence N(n) with a one to one correspondence between p(n) and N(n) numbers. A trivial encoding of the resolution sequence would be when N(n)=2^p(n), in this case, the p(n) integer represents the resolution in number of bits (for example, p(n)=1, N(n)=2, 1-bit resolution, 2 distinct output levels). According to a specific embodiment of this invention, N(n) may be defined by the following formula: N(n)=2^p(n)+1. For example, when p(n) is an integer value of 1, 2 or 3, N(n) assumes a value of 2, 3 or 5, respectively. The sequence length will determine the ability of dithering, according to the teachings of this disclosure, to cancel the undesired idle tones. With a long sequence, even the low-frequency idle tones will be scrambled, and when the sequence is short, dithering only affects the high-frequencies.

Figure 4:
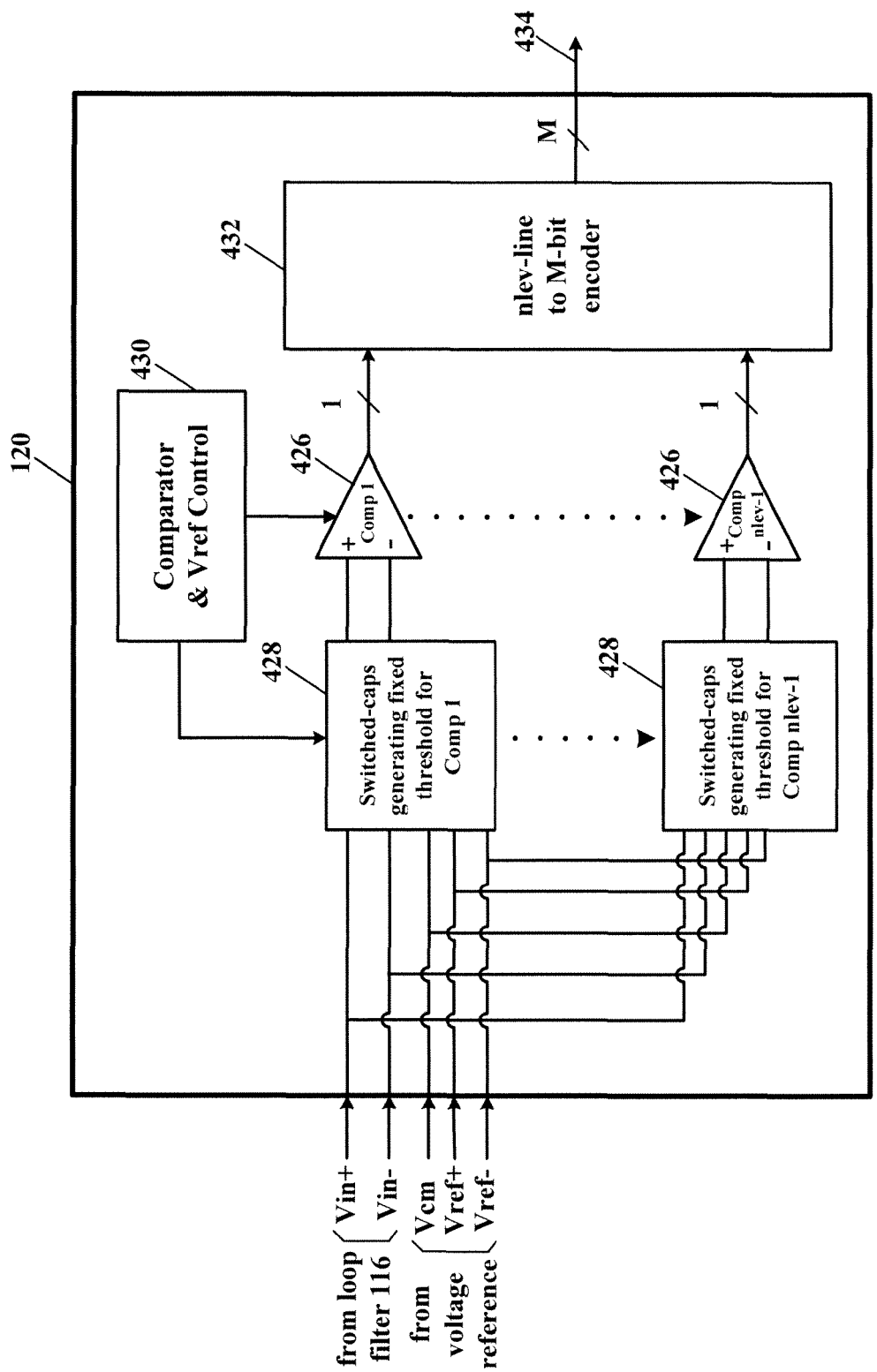
FIG. 4 illustrates a more detailed schematic block diagram of a fixed resolution multi-level quantizer that is based on a flash analog-to-digital converter (ADC) architecture, where each comparator of the flash ADC has dedicated switched-capacitor blocks for generating fixed reference thresholds as used with the sigma-delta M-bit (M>1) modulator shown in FIG. 1.

Referring to FIG. 4, depicted is a more detailed schematic block diagram of a fixed resolution multi-level quantizer that is based on a flash analog-to-digital converter (ADC) architecture, where each comparator of the flash ADC has dedicated switched-capacitor blocks for generating fixed reference thresholds as used with the sigma-delta M-bit (M>1) modulator shown in FIG. 1. The fixed multi-bit quantizer 120 comprises a plurality of voltage comparators 426, each having switched-capacitor blocks 428, a comparator and reference voltage controller 430, and an nlev-line to M-bit encoder (e.g., thermometer encoder).

The switched capacitor blocks 428 are adapted to receive voltage samples Vin from the loop filter 116 and generate fixed threshold reference voltage values (e.g., voltage levels) based upon the switched capacitor ratios, as more fully described in commonly owned U.S. Pat. No. 7,102,558 and incorporated by reference herein for all purposes.

A voltage reference (not shown) is also coupled to the switched capacitor blocks 428 whose switched capacitor ratios create the fixed reference voltage values from this voltage reference Vref and supply the fixed reference voltage values to each respective one of the plurality of voltage comparators 426. One having ordinary skill in the art of electronic circuits and having the benefit of this disclosure would readily understand how to implement such a capacitance ratio switching arrangement for generating fixed reference voltage values used with comparators in the switched capacitor input flash ADC 100.

The plurality of comparators 426 are coupled through the switched-capacitor blocks 428 to differential inputs Vin+ and Vin− that are coupled to the loop filter 116 and thereby receive the sampled voltage Vin.

The switched-capacitor blocks 428 generate nlev−1 different fixed threshold voltages for the nlev−1 comparators 426 that operate in parallel to produce a thermometer encoding of Vin. Preferably, these fixed threshold voltages are derived so that threshold(k)(nlev−2k)/(nlev−1)*Vref for a uniform quantization of the input voltage samples Vin. All outputs from the plurality of comparators 426 are applied to an nlev-line to M-bit encoder 432 for generating an M-bit word for each voltage sample, Vin(n), resulting in a multi-bit bit stream output 434 therefrom.

Figure 5:
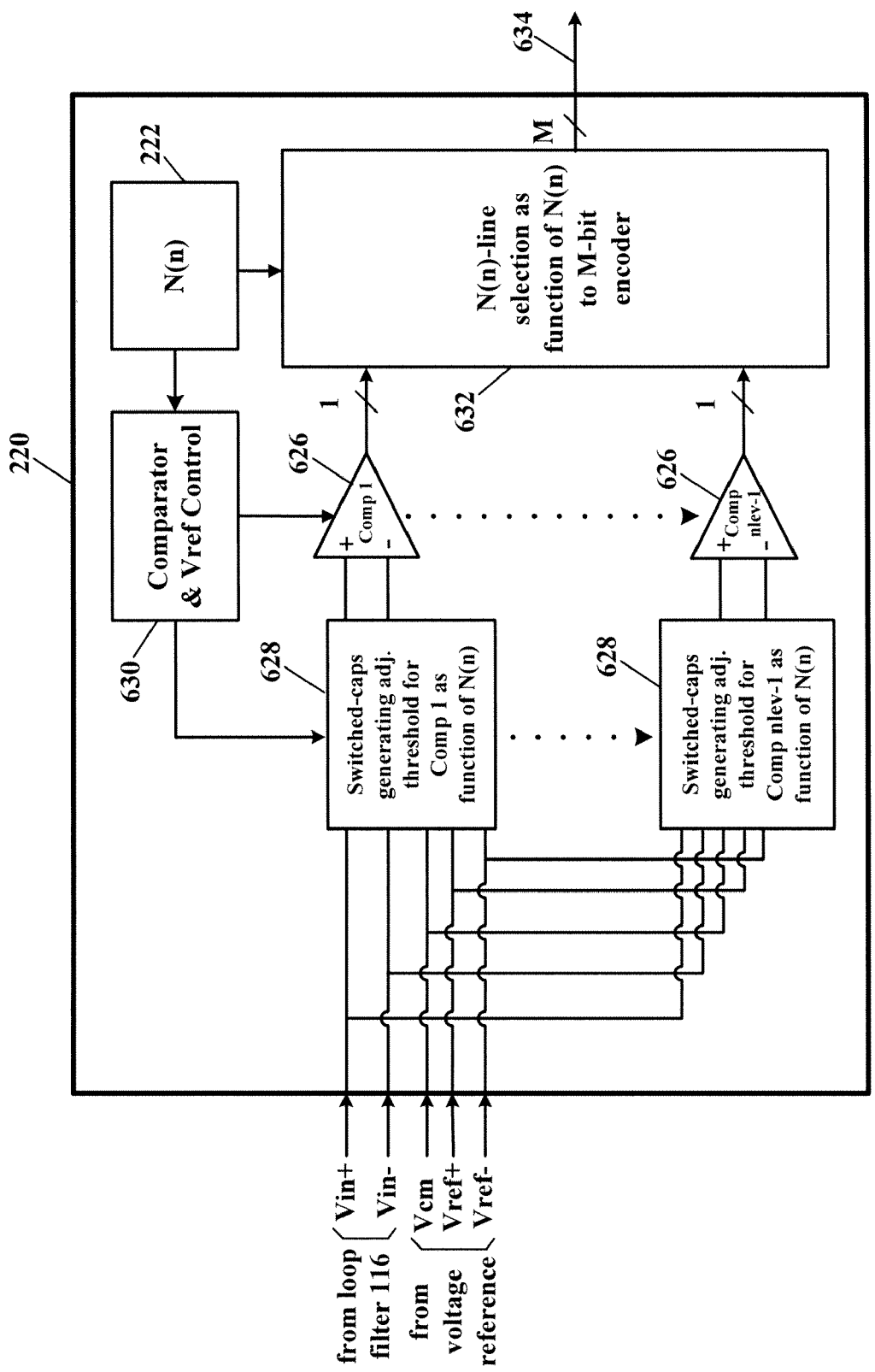
FIG. 5 illustrates a more detailed schematic block diagram of a variable resolution multi-level quantizer that is based on a flash analog-to-digital converter (ADC) architecture coupled to a random or pseudo-random sequence generator, where each comparator of the flash ADC has switched-capacitor blocks for generating various reference thresholds selected by a random or pseudo-random sequence generator as used with the sigma-delta M-bit (M>1) modulator, according to the specific example embodiment shown in FIG. 2.

Referring now to FIG. 5, depicted is a more detailed schematic block diagram of a variable resolution multi-level quantizer that is based on a flash analog-to-digital converter (ADC) architecture coupled to a random or pseudo-random sequence generator, where each comparator of the flash ADC has switched-capacitor blocks for generating various reference thresholds selected by the random or pseudo-random sequence generator as used with the sigma-delta M-bit (M>1) modulator, according to the specific example embodiment shown in FIG. 2. The variable resolution multi-bit quantizer 220 comprises a plurality of voltage comparators 626, each having a switched-capacitor block 628, a comparator and reference voltage controller 630, the random sequence generator 222 having a resolution sequence N(n), and an N(n)-line to M-bit encoder (e.g., thermometer encoder).

Each of the switched capacitor blocks 628 is adapted to receive voltage samples Vin from the loop filter 116 and generate adjustable threshold reference voltage values (e.g., voltage levels) based upon the switched capacitor ratios determined by the resolution sequence N(n) value generated by the random sequence generator 222, as more fully described hereinafter A voltage reference (not shown) is also coupled to the switched capacitor blocks 628 whose selectable switched capacitor ratios create the adjustable reference voltage values from this voltage reference Vref and use the adjustable reference voltage values with respective ones of the plurality of voltage comparators 626. According to the teachings of this disclosure, when a different reference voltage value is required for a particular voltage comparator 626, it is a simple matter to just switch in different ratios of capacitance to achieve the desired reference voltage value based upon the resolution sequence N(n). One having ordinary skill in the art of electronic circuits and having the benefit of this disclosure would readily understand how to implement such a variable capacitance ratio switching arrangement used with comparators in a switched capacitor input flash ADC 200.

The plurality of comparators 626 are coupled through the switched-capacitor blocks 628 to differential inputs Vin+ and Vin− that are coupled to the loop filter 116 and thereby receive the sampled voltage Vin.

The nlev−1 switched-capacitor blocks 628 generate threshold voltages for the nlev−1 comparators 626 that operate in parallel to produce a thermometer encoding of Vin. The threshold voltages are generated specifically for the number of N(n)−1 comparators 626 used in doing the flash conversion. The number of N(n)−1 comparators 626 used are based upon the resolution sequence N(n) value for each input voltage Vin sample taken. For a uniform quantization of the input voltage samples Vin, the threshold voltages may be determined as follows: threshold(k,n)(N(n)−2k)/(N(n)−1)*Vref.

Selected outputs from the plurality of comparators 626 are applied to the N(n)-line to M-bit encoder 632 for generating an M-bit word for each voltage sample, Vin(n), resulting in a multi-bit bit stream output 634 therefrom. Only N(n)−1 outputs from the comparators 626 are used to generate the M-bit word for each input voltage sample n, and the M-bit word thereby has only N(n) distinct values, e.g., output levels.

Figure 6:
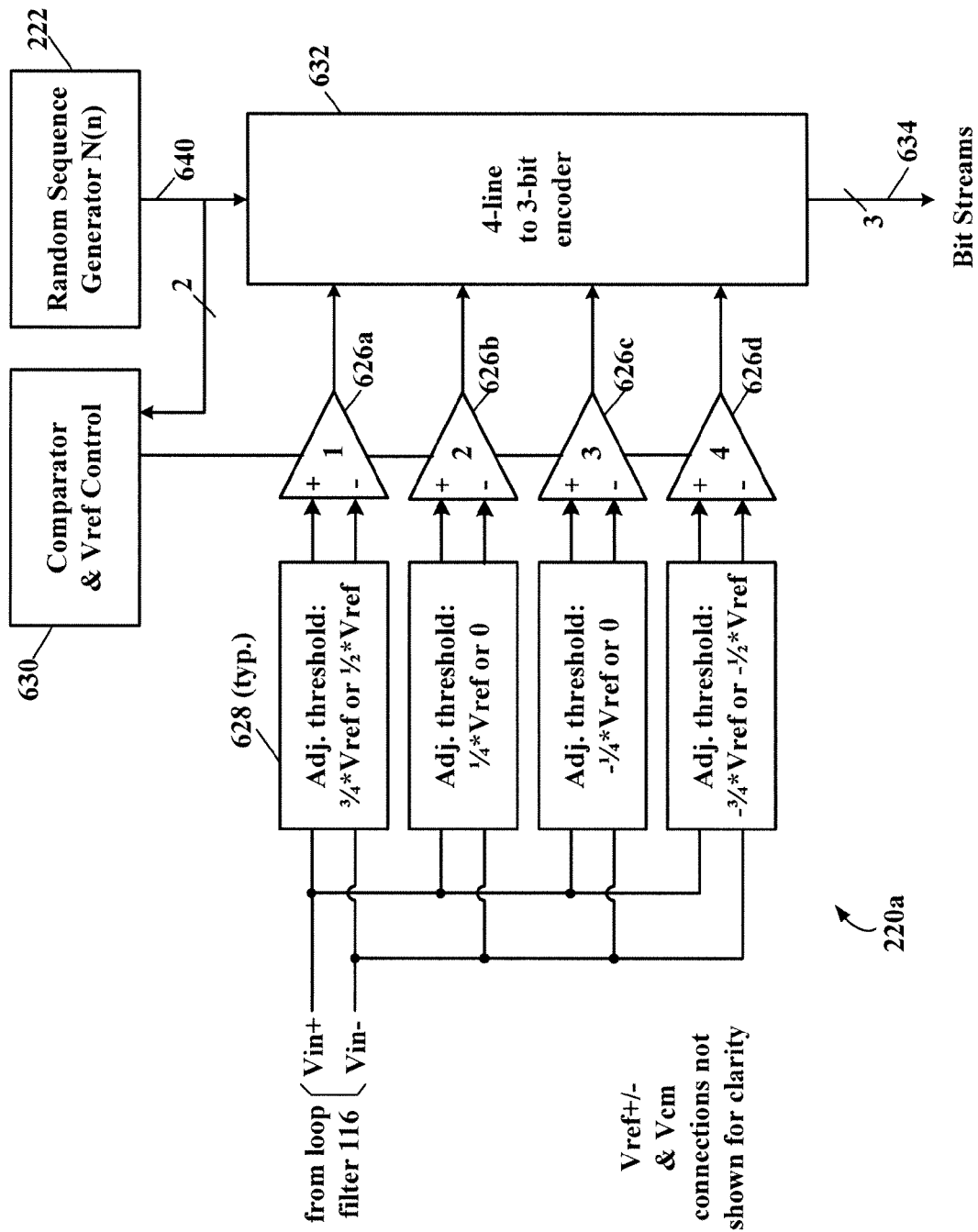
FIG. 6 illustrates a more specific detailed schematic block diagram of a variable resolution (2, 3 or 5 levels) sigma-delta five-level modulator having a quantizer using a flash analog-to-digital converter (ADC) architecture, where each comparator of the flash ADC has switched-capacitor blocks for generating the required threshold of each comparator, according to the specific example embodiment shown in FIGS. 2 and 5.

Referring to FIG. 6, depicted is a more specific detailed schematic block diagram of a variable resolution (2, 3 or 5 levels) sigma-delta five-level modulator having a quantizer using a flash analog-to-digital converter (ADC) architecture, where each comparator of the flash ADC has switched-capacitor blocks for generating the required threshold of each comparator, according to the specific example embodiment shown in FIGS. 2 and 5. For this specific example embodiment, the outputs 634 are −2, −1, 0, 1 or 2 so that a five-level DAC, as more fully described in U.S. Pat. No. 7,102,558, incorporated by reference herein for all purposes, may be used for any resolution sequence N(n). Also an implementation of the switched-capacitor blocks 628 for 2, 3 or 5 levels is simple because only two of the switched-capacitor blocks 628 are different and have only two thresholds to choose from. This implementation ensures uniform quantization for all N(n) values because thresholds conform to (N(n)−2k)/(N(n)−1)*Vref for the active comparators.

The random sequence generator 222 may randomly generate the following codes at its 2-bit output 640 as 00b for 2 output levels (N(n)=2), 01b for 3 output levels (N(n)=3), and 11b for 5 output levels (N(n)=5).

A five-level bit stream from the output 634 of the encoder 632 may be encoded on 3 bits (e.g., 2's complement) as $010_b$ for +2, $001_b$ for +1, $000_b$ for 0: $111_b$ for −1, and $110_b$ for −2.

Switched-capacitor blocks for comparator 626a and 626d have the same implementation but have Vref+/− inputs reversed, and the same for comparator 626b and 626c.

When N(n)=5, all comparators 626 are used where the threshold for comparator 626a is ¾*Vref, the threshold for comparator 626b is ¼*Vref, the threshold for comparator 626c is −¼*Vref, and the threshold for comparator 626d is −¾*Vref.

When N(n)=3, only comparators 626a and 626d are used where the threshold for comparator 626a is +½*Vref, the threshold for comparator 626b is 0, the threshold for comparator 626c is 0, and the threshold for comparator 626d is −½*Vref.

When N(n)=2, only comparator 626b is used where the threshold for comparator 626a is +½*Vref, the threshold for comparator 626b is 0, the threshold for comparator 626c is 0, and the threshold for comparator 626d is −½*Vref.

Figure 7:
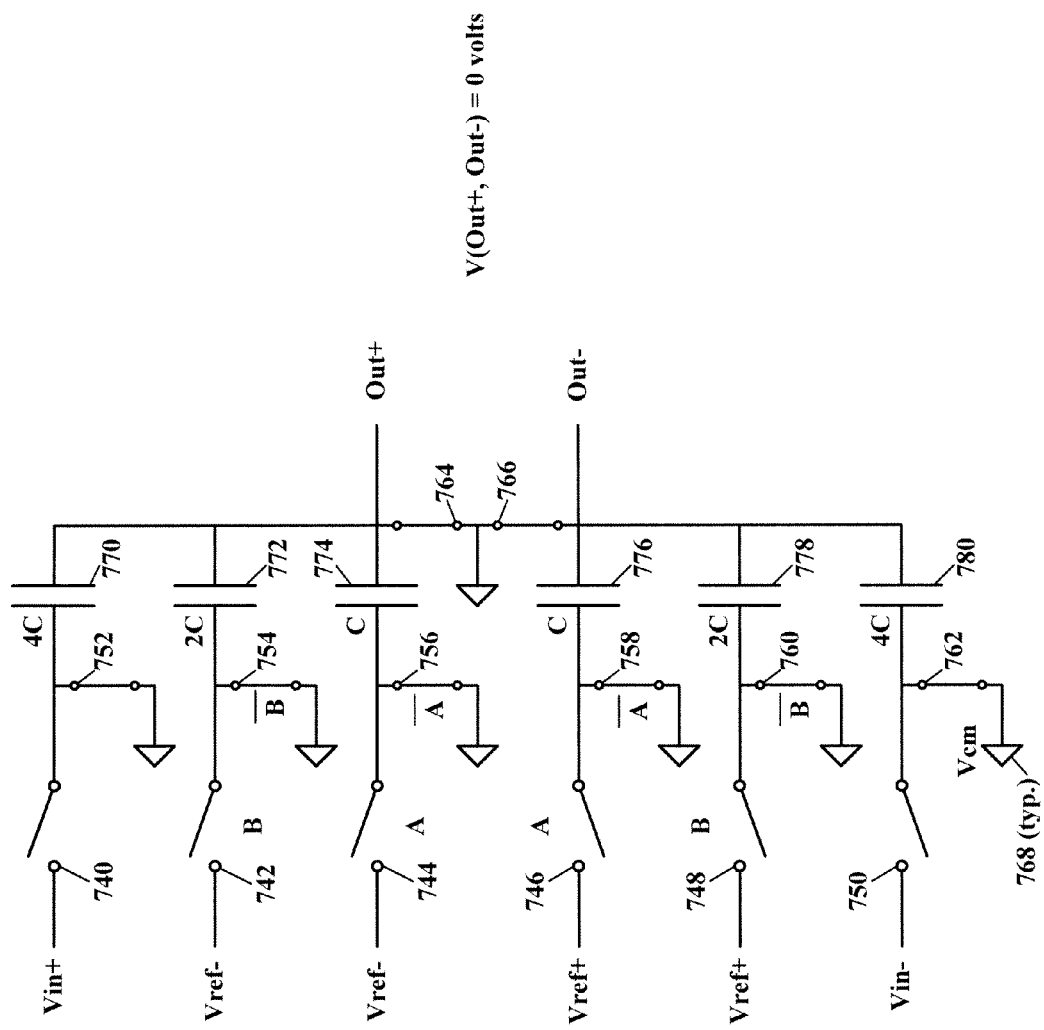
FIG. 7 illustrates a more detailed schematic diagram of the switched capacitor block switching configuration during phase P1 as used with comparators 1 and 4 of the variable resolution (2, 3 or 5 levels) sigma-delta five-level modulator shown in FIG. 6.

Referring to FIG. 7, depicted is a more detailed schematic diagram of the switched capacitor block switching configuration during phase P1 as used with comparators 1 and 4 of the variable resolution (2, 3 or 5 levels) sigma-delta five-level modulator shown in FIG. 6. For a more detailed schematic and description of a switched capacitor sigma-delta ADC see commonly owned U.S. Pat. No. 7,102,558; incorporated by reference herein for all purposes. During phase P1 of an input voltage sample, the initialization phase (or reset phase), all capacitors 770-780 are discharged to the common-mode voltage Vcm 768 (e.g., ground or power supply common) through switches 752-766.

Figure 8:
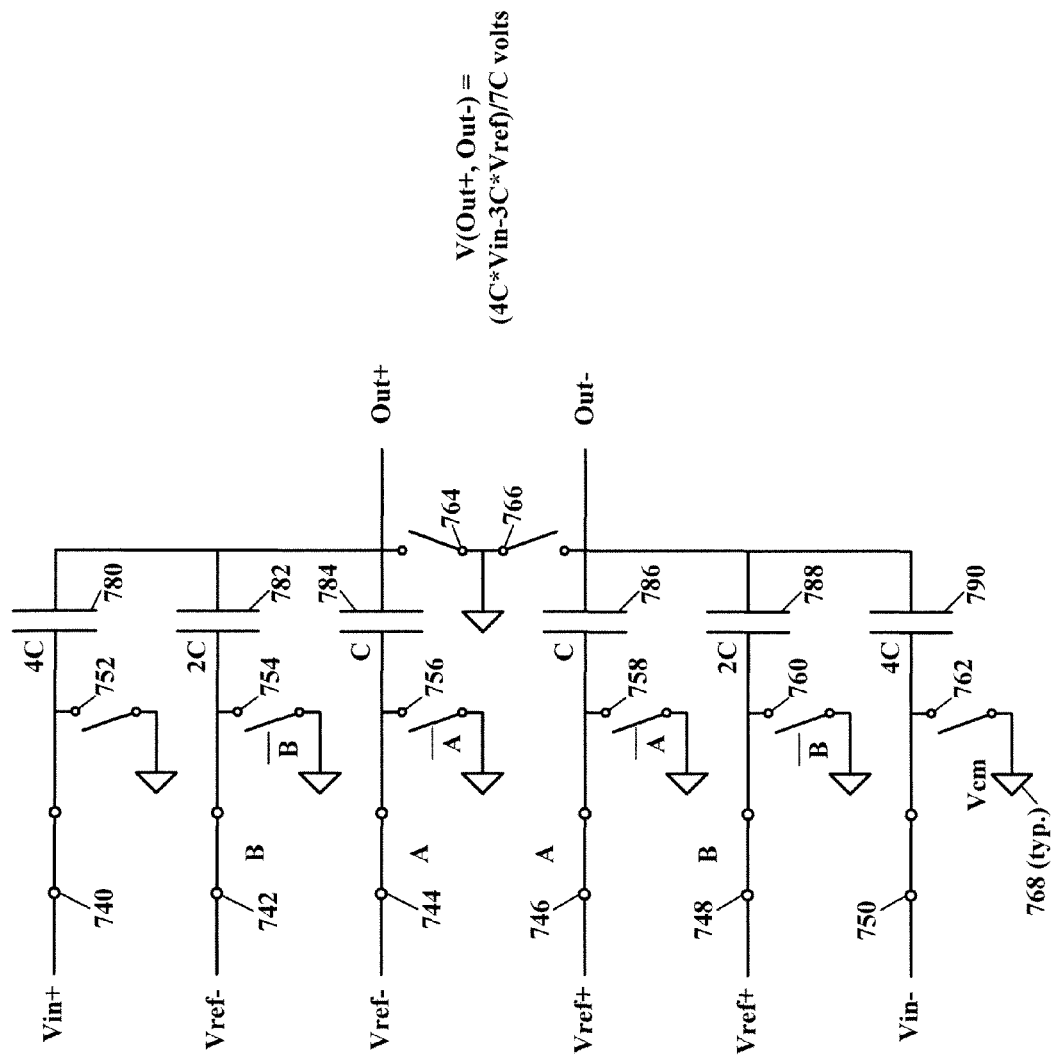
FIG. 8 illustrates the schematic diagram of the switching configuration of FIG. 7 during phase P2 when a comparison is being made of Vin to a threshold of ¾*Vref.

Referring to FIG. 8, depicted is the schematic diagram of the switching configuration of FIG. 7 during phase P2 when a comparison is being made of Vin to a threshold of ¾*Vref. During the comparison phase P2, a certain amount of charge is transferred to the output node, Out+/−. This output node is the input of one of the comparators of the Flash ADC and this comparator is latched at the end of the phase P2. The amount of charge transferred at the end of the phase P2 is:

$$4C*(Vin+-Vin-)+2C*B*(Vref--Vref+)+C*A*(Vref--Vref+)$$

When switches 740-750 are on (closed) and switches 752-766 are off (open), A=1 and B=1, during phase P2, and the voltage at the output node, Out+/−, is equal to:

$$(4C*(Vin+-Vin-)+3C*(Vref--Vref+))/7C,$$

that can be rewritten as:

$$(4*Vin-3*(Vref))/7.$$

The output node voltage Vout is positive when Vin>¾*Vref and is negative when Vin<¾*Vref, thus the threshold is ¾*Vref.

Figure 9:
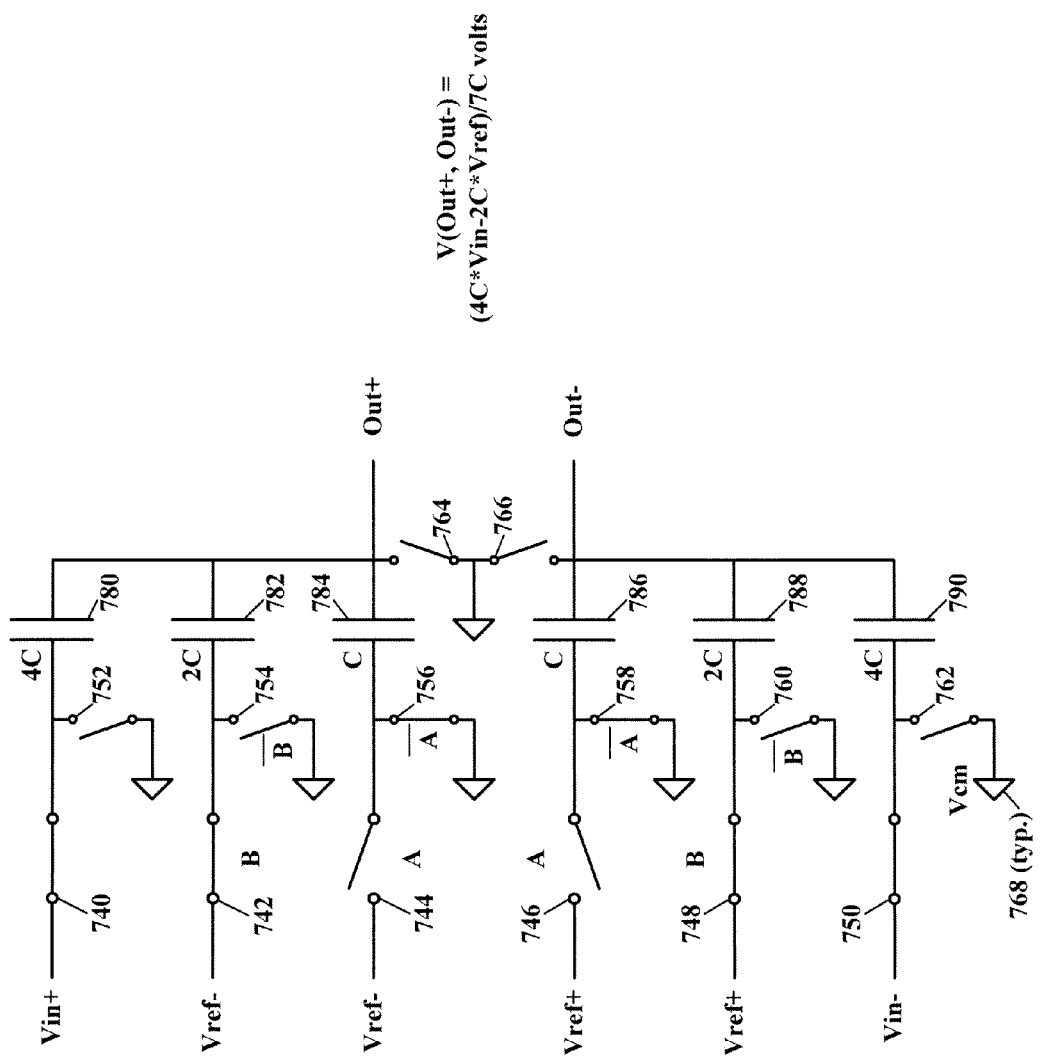
FIG. 9 illustrates the schematic diagram of the switching configuration of FIG. 7 during phase P2 when a comparison is being made of Vin to a threshold of ½*Vref.

Referring to FIG. 9, depicted is the schematic diagram of the switching configuration of FIG. 7 during phase P2 when a comparison is being made of Vin to a threshold of ½*Vref. When switches 740, 742, 748, 750, 756 and 758 are on (closed) and switches 744, 746, 752, 754, 760, 762, 764 and 766 are off (open), A=0 and B=1, during phase P2, and the voltage at the output node, Out+/−, is equal to:

(4C*(Vin+−Vin−)+2C*(Vref−−Vref+))/7C, that can be rewritten as:

(4*Vin−2*(Vref))/7.

The output node voltage Vout is positive when Vin>½*Vref and is negative when Vin<½*Vref, thus the threshold is ½*Vref.

Similarly, when switches 740, 744, 746, 750, 754 and 760 are on (closed) and switches 742, 748, 752, 756, 758, 762, 764 and 766 are off (open), A=1 and B=0, during phase P2, and the threshold becomes ¼*Vref. When 740, 750, 754, 756, 758 and 760 are on (closed) and switches 742, 744, 746, 748, 752, 764 and 766 are off (open), A=1 and B=0, during phase P2, and the threshold becomes ¼*Vref. When 740 and 750 are on (closed) and switches 742-748 and 752-766 are off (open), A=0 and B=0, during phase P2, a sign detector may be used for determining the threshold, i.e., threshold is substantially 0 volts.

Therefore by selectively turning off (open) or on (close) switches 742-748 during phase P2 the threshold(s) of the ADC 200 may be either five (5), three (3) or two (2) levels, according to the teachings of this disclosure. Therefore, as discussed more fully hereinabove, the thresholds for a five (5) level ADC 200 are: +¾*Vref, +¾*Vref, −¾*Vref and −¼*Vref; the thresholds for a three (3) level ADC 200 are: +½*Vref and −½*Vref; and for a two (2) level ADC 200 a sign detector may be used, e.g., threshold of about 0 volts. The turning off or on of the switches 742-748 during P2 phase may be controlled by the random sequence generator 222 with appropriate glue logic (not shown).

Figure 10:
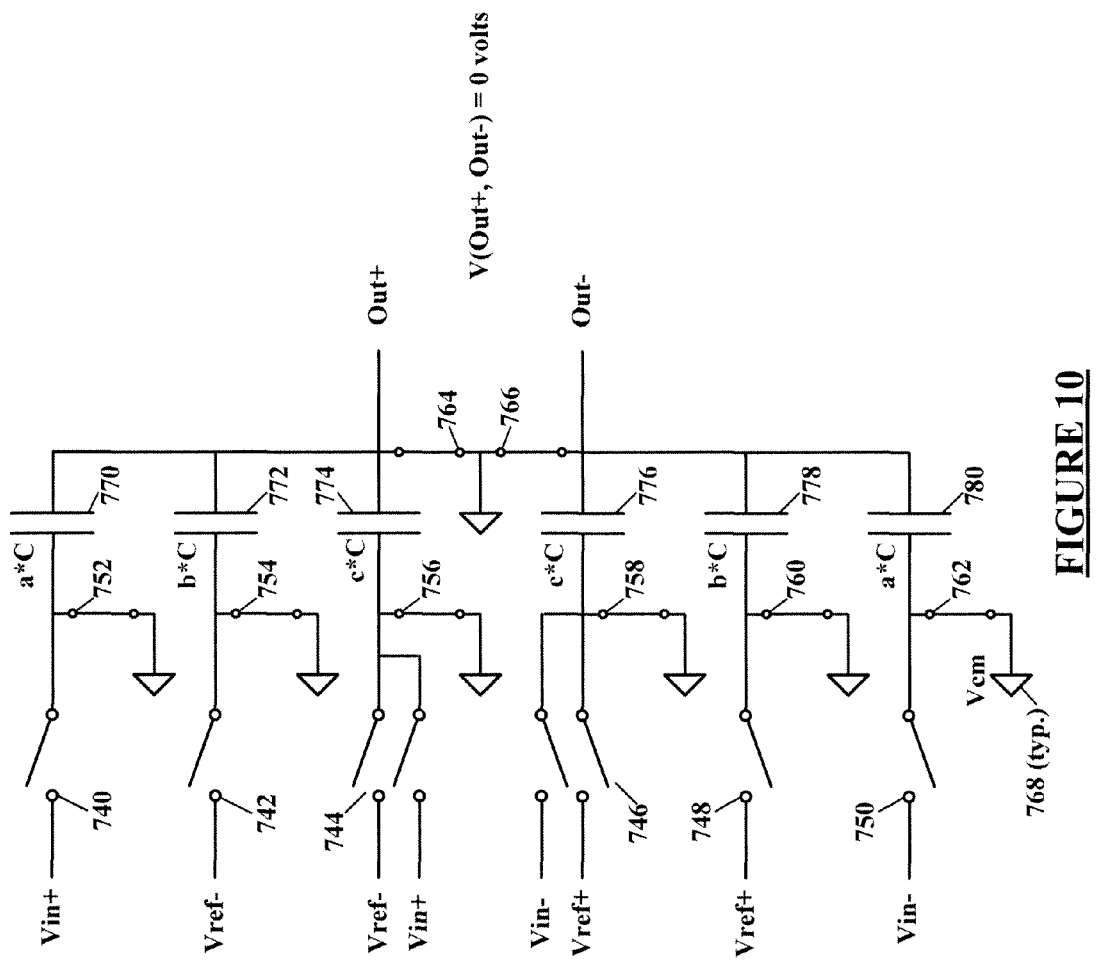
FIG. 10 illustrates a more detailed schematic diagram of a switched capacitor block that generates any threshold b/a*Vref, wherein the switching configuration thereof is shown during phase P1 as used with comparators of the variable resolution quantizer (Flash ADC implementation) shown in FIG. 5.

Referring to FIG. 10, depicted is a more detailed schematic diagram of a switched capacitor block that generates any threshold b/a*Vref, wherein the switching configuration thereof is shown during phase P1 as used with comparators of the variable resolution quantizer (Flash ADC implementation) shown in FIG. 5. Each switched capacitor block 628 (FIG. 5) whose selectable switched capacitor ratios create the adjustable reference voltage values from the voltage reference Vref. The switched capacitor block 628 includes a parallel arrangement of "a" unit capacitors (where "a" is an integer) of C value connected to Vin+ and Vin−, respectively, through the switches 740 and 750; "b" unit capacitors (where "b" is an integer) of C value connected to Vref− and Vin+, respectively, through the switches 742 and 748; and "c" unit capacitors (where "c" is an integer) of C value connected to (Vref− or Vin+) and (Vref+ or Vin−), respectively, through an arrangement of the switches 744 and 746. FIG. 10 illustrates the switched capacitor block 628 in the phase P1 (reset phase) where all of the capacitors are connected to the common-mode voltage Vcm 768 through the switches 752-766 so that their charge is reset to substantially zero volts, whereby V(Out+, Out−)=0 at the end of phase P1.

Figure 11:
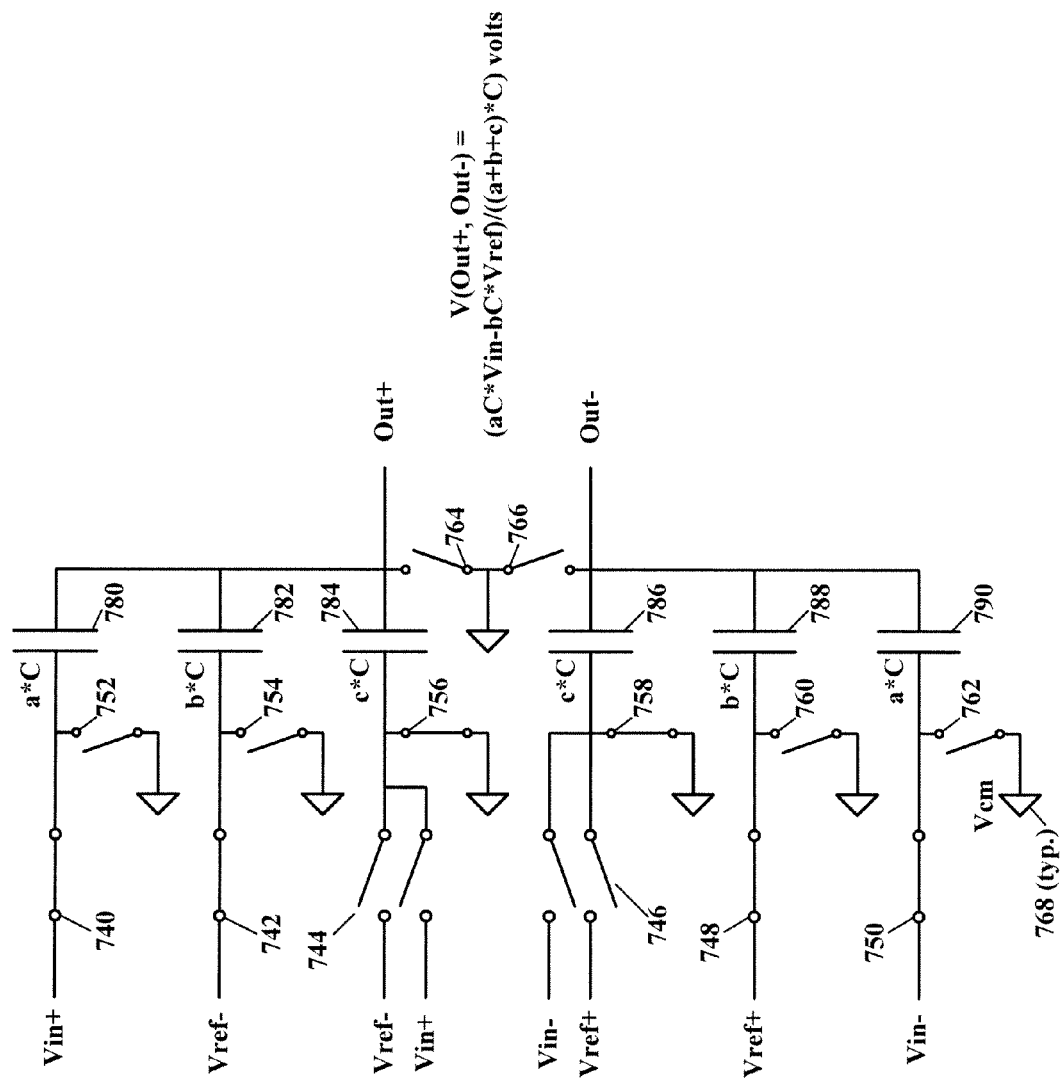
FIG. 11 illustrates a more detailed schematic diagram of a switched capacitor block that generates any threshold b/a*Vref, wherein the switching configuration thereof is shown during phase P2 as used with comparators of the variable resolution quantizer (Flash ADC implementation) shown in FIG. 5.

Referring to FIG. 11, depicted is a more detailed schematic diagram of a switched capacitor block that generates any threshold b/a*Vref, wherein the switching configuration thereof is shown during phase P2 as used with comparators of the variable resolution quantizer (Flash ADC implementation) shown in FIG. 5. The switched capacitor block 628 (FIG. 5) is in the phase P2 (comparison phase) where the switches 740, 750, 742 and 748 are turned on while the switches 752, 754, 760 and 762 are turned off. During the comparison phase P2, a certain amount of charge is transferred to the output node, Out+/−. This output node is coupled to the input of a respective one of the comparators 626 of the Flash ADC (FIG. 5) and the output of the comparator 626 is latched at the end of the phase P2. The amount of charge transferred at the end of the phase P2 is:

a*C*(Vin+−Vin−)+b*C*(Vref−−Vref+)

and the voltage at the output node, Out+/−, is equal to:

(a*C*(Vin+−Vin−)+b*C*(Vref−−Vref+))/
((a+b+c)*C), that can be rewritten as:

(a*Vin−b*(Vref))/(a+b+c).

The output node voltage Vout is positive when Vin>b/a*Vref and is negative when Vin<b/a*Vref, thus the threshold is b/a*Vref. With this configuration, any b/a*Vref threshold may be configured so long as there are enough capacitors to obtain the threshold granularity desired. Any −b/a threshold may also be obtained if the Vref+ and Vref− nodes are swapped as shown in FIGS. 10 and 11. It may be noted that the arrangements of the capacitor 784 and 786 containing c unit capacitors do not contribute to the threshold calculation because these capacitors are charged at the same common voltage VCM 628 on both phases, and thus do not contribute to the charge transfer between the two phases P1 and P2.

For a uniform quantization, the threshold for the comparator k takes the form:

threshold(k)=(nlev−2k)/(nlev−1)*Vref for a fixed quantizer, and threshold(k,n)=(N(n)−2k)/(N(n)−1)*Vref with N(n) being between 2 and nlev as disclosed herein previously. By assigning a=nlev−1 and b=Abs(nlev−2k) for a fixed quantizer, and a(n)=N(n)−1 and b(n)=Abs(N(n)−2k) for a variable quantizer, the switched capacitor block 628 may provide all of the desired values required for thresholds and give a uniform quantization in a general manner for both fixed and variable resolution quantizers. It should be noted that when N(n)−2k is negative, the Vref+ and Vref− nodes are reversed in the schematics.

Since a(n)=N(n)−1, the number of capacitors coupled to Vin+/− through the switches 740 and 750 vary at each sample n for a variable resolution with uniform quantization. This may be easily done by splitting the switches 740 and 750 into multiple parallel switches connected to a portion or just one of the total number of "A" capacitors available. In this way, if a total number of "A" capacitors are available originally, then only a(n) capacitors may be connected to Vin+/− at each sample during phase P2, while the remainder A−a(n) will be connected to the common voltage VCM 768, and will be part of the c unit capacitors shown in FIGS. 10 and 11. Being part of the c unit capacitor arrangements, they will not have any impact on the establishment of the threshold (their charge contribution is 0). Since N(n) is an integer between 2 and nlev, the maximum total number A of capacitors needed is equal to nlev−1. In this case, out of the A=nlev−1 capacitors available, a(n)=N(n)−1 capacitors will be tied to Vin+/− during phase P2, and nlev−1−a(n)=nlev−N(n) caps will be part of the c unit capacitor arrangements connected to the common voltage VCM 768 during phase P2.

Since b(n)=N(n)−2k, the number of capacitors coupled to Vref+/− through switches 742 and 748 need to vary at each sample n for a variable resolution with uniform quantization. This may be easily done by splitting the switches 742 and 748 into multiple parallel switches connected to a portion or just one of the total number B of capacitors available. In this way, if a total of B capacitors are available originally, only b(n) capacitors can be connected to Vref+/− at each sample during phase P2, while the remaining B−b(n) capacitors will be connected to the common voltage VCM 768 and will be part of the c unit capacitors shown in FIGS. 10 and 11. Being part of the c unit capacitor arrangement, they will not have any impact on the establishment of the threshold (their charge contribution is 0). Since N(n) is an integer between 2 and nlev, and since k is an integer between 1 and nlev−1, the maximum total number B of capacitors required is equal to nlev−2. In this case, out of the B=nlev−2 capacitors available, b(n)= N(n)−2k caps will be coupled to Vref+/− during phase P2 and nlev−2−b(n)nlev−N(n)+2k−2 capacitors will be part of the c unit capacitor arrangement and connected to the common voltage VCM 768 during phase P2. If b(n) is negative, reversing Vref+/− is required and the same reasoning would also apply to b(n)=Abs(N(n)−2k).

In order to realize a proper uniform quantization, with any N(n) number of levels, the maximum number of capacitors used in both the Vin+/− and Vref+/− arrangement is A=nlev−1 and B=nlev−2, so the total number of capacitors is 2*(nlev−1)+2*(nlev−2)=4*nlev−6. Out of these (4*nlev−6) unit capacitors of C value, the number of capacitors at each sample n in the arrangements of the switches 780 and 790 shown in FIGS. 10 and 11 is equal to a(n)=N(n)−1, the number of capacitors at each sample n in the arrangements of the switches 782 and 788 shown in FIGS. 10 and 11 is equal to b(n)=Abs(N(n)−2k). Thus the remainder of unit capacitors whose number is equal to $$c(n)=A+B-a(n)-b(n)=2*nlev-3-(N(n)-1)-Abs(N(n)-2k)$$

is connected in the arrangements of switches 784 and 786 at each sample n. The reassignment of the c(n) unit capacitors to the a(n) or b(n) configurations may be made by turning on selected switches in the arrangement of switches 744 and 746 and turning off selected arrangements of switches 756 and 758 in phase P2. In this way the threshold realized by this variable distribution of capacitors at each sample n is $$\text{threshold}(k,n)=(N(n)-2k)/(N(n)-1)*Vref$$

at each sample n and for each comparator k as long as there is enough in total number of unit capacitors and associated switches that are split in the proper manner to obtain the threshold granularity desired.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for reduction of unwanted idle tones by dithering a variable resolution nlev (nlev>2) quantizer of a multi-bit (M-bit, M>1, M=Floor(log 2(nlev))) sigma-delta analog-to-digital converter (ADC), comprising:

a multi-bit (M-bit, M>1) sigma-delta modulator comprising
a multi-level digital-to-analog converter (DAC),
an analog voltage summation circuit coupled to the multi-level DAC,
an analog loop filter coupled to an output of the analog voltage summation circuit,
a variable resolution quantizer having nlev (nlev>2) levels coupled to the analog loop filter,
an encoder coupled to the variable resolution quantizer, wherein the encoder converts outputs from the variable resolution quantizer into binary representations thereof and the binary representations are applied to the multi-level DAC, and
a random sequence generator coupled to the variable resolution quantizer, wherein the random sequence generator generates a plurality of random numbers N(n) in a sequence, where N(n) are random integer numbers between 2 and nlev,
whereby resolutions of the variable resolution quantizer are determined by respective ones of the plurality of random numbers N(n) for each analog voltage sample taken by the sigma-delta modulator;
a voltage reference coupled to the multi-level DAC; and
a digital filter coupled to the encoder and receiving the binary representations therefrom.

2. The apparatus according to claim 1, wherein the random number sequence generator comprises:
a linear feedback shift register (LFSR) having an R-bit output, where R is the number of bits of the LFSR output and is a positive integer value;
a plurality of digital comparators, each of the plurality of digital comparators having a different digital threshold, an R-bit digital input coupled to the LFSR, and a digital output; and
a digital adder having inputs coupled to the digital outputs of the plurality of digital comparators, and an output coupled to the variable resolution quantizer.

3. The apparatus according to claim 2, wherein the LFSR is a Galois LFSR.

4. The apparatus according to claim 1, wherein the variable resolution quantizer is a flash ADC comprising a plurality of voltage comparators having selectably generated threshold voltages, wherein the selectably generated threshold voltages are controlled by the plurality of random numbers N(n).

5. The apparatus according to claim 4, wherein the selectably generated threshold voltages are determined by switched input capacitor ratios for each of the plurality of voltage comparators.

6. The apparatus according to claim 1, wherein which levels of the multi-level (DAC) are used with the analog voltage samples taken are determined by the plurality of random numbers N(n).

7. The apparatus according to claim 1, wherein each analog voltage sample and generation of respective ones of the random number sequences N(n) occur at substantially the same times.

8. The apparatus according to claim 1, wherein each analog voltage sample and generation of respective ones of the random number sequences N(n) occur at frequency fs intervals.

9. The apparatus according to claim 1, wherein which outputs from the variable resolution flash ADC are used for conversion to the binary representations are based upon the plurality of random numbers N(n).

10. The apparatus according to claim 1, wherein the plurality of random numbers are a plurality of pseudo random numbers, and the random sequence generator is a pseudo random sequence generator.

11. The apparatus according to claim 1, wherein the variable resolution quantizer comprises a plurality of quantizers and at least one of the plurality of quantizers is a variable resolution quantizer.

12. The apparatus according to claim 1, wherein the sigma-delta modulator is multi-loop.

13. A method for reducing unwanted idle tones by dithering a variable resolution nlev (nlev>2) quantizer of a multi-bit (M-bit, M>1, M=Floor(log 2(nlev))) sigma-delta analog-to-digital converter (ADC), said method comprising the steps of:

generating random numbers N(n) in a random sequence with a random sequence generator, where N(n) are random integer numbers between 2 and nlev;

controlling voltage thresholds and number of distinct output levels nlev (nlev>2) of a variable resolution quantizer with the random numbers N(n);

encoding outputs from the variable resolution quantizer, based upon the random numbers N(n), into binary representations thereof;

controlling output voltage values from a multi-level digital-to-analog converter (DAC) with the binary representations;

adding the voltage values from the multi-level DAC to input voltage samples in an analog voltage summation circuit;

filtering the sum of the voltage values and the input voltage samples in an analog loop filter; and applying the filtered sum of the voltage values and the input voltage samples to the variable resolution quantizer.

14. The method according to claim 13, wherein the step of generating the sequence of random numbers N(n) comprises the steps of:

providing a linear feedback shift register (LFSR) having an R-bit output, where R is the number of bits of the LFSR output and is a positive integer value;

providing a plurality of digital comparators, each of the plurality of digital comparators having a different digital threshold, an R-bit digital input coupled to the LFSR, and a digital output; and providing a digital adder having inputs coupled to the digital outputs of the plurality of digital comparators, and an output coupled to the variable resolution quantizer, whereby the sequence of random numbers N(n) are generated.

15. The method according to claim 14, wherein the LFSR is a Galois LFSR.

16. The method according to claim 13, wherein the step of controlling voltage thresholds and number of distinct output levels of a variable resolution quantizer comprises the step of controlling voltage thresholds and number of distinct output levels of a flash ADC comprising a plurality of voltage comparators having selectably generated threshold voltages, wherein the selectably generated threshold voltages are controlled by the plurality of random numbers N(n).

17. The apparatus according to claim 16, wherein the selectably generated threshold voltages are determined by switched input capacitor ratios for each of the plurality of voltage comparators.

18. The method according to claim 13, wherein the step of generating a plurality of random numbers comprises the step of generating pseudo random numbers N(n) in a pseudo random sequence with a pseudo random sequence generator, where N(n) are pseudo random integer numbers between 2 and nlev.

19. The method according to claim 13, wherein the variable resolution quantizer comprises a plurality of quantizers and at least one of the plurality of quantizers is a variable resolution quantizer.

20. The method according to claim 13, wherein the sigma-delta modulator is multi-loop.

\* \* \* \* \*